(12) United States Patent
Korsunsky et al.

(10) Patent No.: US 7,097,465 B1
(45) Date of Patent: Aug. 29, 2006

(54) HIGH DENSITY CONNECTOR WITH ENHANCED STRUCTURE

(75) Inventors: Iosif R. Korsunsky, Harrisburg, PA (US); Brian J. Gillespie, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/251,126

(22) Filed: Oct. 14, 2005

(51) Int. Cl.
*H01R 12/00* (2006.01)

(52) U.S. Cl. .................................................. 439/74

(58) Field of Classification Search .................. 439/74, 439/83, 65, 75
See application file for complete search history.

(56) References Cited

U.S. PATENT DOCUMENTS

| | | | |
|---|---|---|---|
| 4,740,180 A * | 4/1988 | Harwath et al. | 439/856 |
| 5,098,311 A * | 3/1992 | Roath et al. | 439/295 |
| 5,876,219 A * | 3/1999 | Taylor et al. | 439/74 |
| 6,042,389 A * | 3/2000 | Lemke et al. | 439/74 |
| 6,079,991 A * | 6/2000 | Lemke et al. | 439/83 |
| 6,093,035 A * | 7/2000 | Lemke et al. | 439/83 |
| 6,155,860 A * | 12/2000 | Lemke et al. | 439/341 |
| 6,164,983 A * | 12/2000 | Lemke et al. | 439/83 |
| 6,183,268 B1 * | 2/2001 | Consoli et al. | 439/74 |
| 6,193,537 B1 * | 2/2001 | Harper et al. | 439/291 |
| 6,241,535 B1 * | 6/2001 | Lemke et al. | 439/83 |
| 6,325,644 B1 * | 12/2001 | Lemke et al. | 439/83 |
| 6,350,141 B1 * | 2/2002 | Houtz | 439/341 |
| 6,443,745 B1 * | 9/2002 | Ellis et al. | 439/101 |
| 6,471,526 B1 * | 10/2002 | Harper, Jr. | 439/83 |
| 6,482,050 B1 * | 11/2002 | Lemke et al. | 439/856 |
| 6,527,597 B1 * | 3/2003 | Harper, Jr. | 439/701 |
| 6,558,170 B1 * | 5/2003 | Lemke | 439/83 |
| 6,595,788 B1 * | 7/2003 | Harper et al. | 439/83 |
| 6,638,082 B1 * | 10/2003 | Belopolsky et al. | 439/83 |
| 6,672,907 B1 * | 1/2004 | Azuma | 439/682 |
| 6,699,048 B1 * | 3/2004 | Johnson et al. | 439/74 |
| 6,712,626 B1 * | 3/2004 | Harper, Jr. et al. | 439/83 |
| 6,809,537 B1 * | 10/2004 | Adams | 324/755 |
| 6,830,457 B1 * | 12/2004 | Korsunsky et al. | 439/41 |
| 6,830,462 B1 * | 12/2004 | Harper, Jr. | 439/71 |
| 6,851,954 B1 * | 2/2005 | Ashman et al. | 439/70 |
| 6,860,741 B1 * | 3/2005 | Ashman et al. | 439/70 |
| 6,866,521 B1 * | 3/2005 | Harper, Jr. | 439/71 |
| 6,869,292 B1 * | 3/2005 | Johnescu et al. | 439/74 |
| 6,918,776 B1 * | 7/2005 | Spink, Jr. | 439/74 |
| 6,926,538 B1 * | 8/2005 | Ma | 439/74 |
| 6,928,727 B1 * | 8/2005 | Ashman et al. | 29/843 |
| 6,955,545 B1 * | 10/2005 | Morana et al. | 439/83 |
| 7,001,190 B1 * | 2/2006 | Morana et al. | 439/81 |
| 2002/0142629 A1 * | 10/2002 | Zaderej et al. | 439/74 |

(Continued)

*Primary Examiner*—Ross N. Gushi
(74) *Attorney, Agent, or Firm*—Wei Te Chung

(57) ABSTRACT

An electrical connector (1) includes a housing (2) and conductive contacts (3) partially positioned in the housing. The housing has a base wall (20) and side wall (21). The top edge of the side wall has a thickness larger than other portion of the side wall. Each contact has a body portion (31) and a pair of cantilevered beams (32) extending from the body portion. A stabilizer (4) is assembled in the housing. The stabilizer provides a general flat planar surface (40) on a top and defines a number of cavities (41) exposed to the surface. The cantilevered beams extend through the cavities of the stabilizer and exposed partially outside the surface thereof.

13 Claims, 10 Drawing Sheets

U.S. PATENT DOCUMENTS

| | | |
|---|---|---|
| 2003/0134527 A1* | 7/2003 | Johnson et al. ............... 439/74 |
| 2004/0157477 A1* | 8/2004 | Johnson et al. ............... 439/74 |
| 2004/0185691 A1* | 9/2004 | Ma ............................ 439/74 |
| 2005/0009385 A1* | 1/2005 | Korsunsky et al. ........... 439/83 |
| 2005/0059268 A1* | 3/2005 | Yu .............................. 439/65 |
| 2005/0239304 A1* | 10/2005 | Morana et al. ............... 439/83 |

* cited by examiner

HIGH DENSITY CONNECTOR WITH ENHANCED STRUCTURE

BACKGROUND OF THE INVENTION

1. Field of the Invention

The present invention generally relates to a low profile electrical connector for interconnecting two printed circuit boards, and particularly to a high speed, high density connector having enhanced structure for insuring a reliable signal transmission.

2. Description of Related Art

Continued advances in the design of electronic devices for data processing and communications systems have placed rigorous demands on the design of electrical connectors. Specifically, electrical connectors having higher densities and pin counts require careful consideration of the problems which result from decreasing the distance between contacts. Understandably, greater density cannot sacrifice electrical or mechanical performance of a connector.

A difficulty in designing high density connectors having a low-mated height is in maintaining proper alignment of the contact elements of engaged connectors so as to insure reliable electrical connections therebetween. U.S. Pat. Nos. 6,042,389, 6,093,035, 6,471,526, and 6,558,170, issued to Lemke et al. and Harper, disclose high-density, high-speed, board-to-board connectors. These connectors have a respective receptacle and a respective plug. The receptacle includes a receptacle housing receiving therein a number of receptacle contacts coupled to a first substrate, while the plug includes a plug housing receiving therein a number of plug contacts coupled to a second substrate and establishing electrical connection with receptacle contacts of the receptacle. However, the problem to maintain proper alignment of contacts during mating procedure is not solved and no particular enhanced structure is provided to insure a reliable electrical connection from the first substrate to the second substrate.

With the increased demands for miniaturization of the data processing and communication systems, another design problem resulting from high density, low-mated height connectors is that the tiny, slender contact elements are susceptible to damage if used improperly. U.S. Pat. Nos. 6,471,526 and 6,558,170 disclose two-beam contacts resided within apertures of the housing. The contacts have upper arms flexibly connected to tail portions. Upper arms have a converging section and an outwardly diverging lead-in section. As plug and receptacle mate, upper portions of plug contacts flexibly engage upper arms of receptacle contacts, which accept upper portions of the plug contacts into outwardly diverging lead-in sections. Referring particularly to figures of the cited patents, it is easy to see that the upper arms of the receptacle contacts extend beyond a relatively large distance from a mating face of the receptacle. When engaging with the plug, the receptacle contacts will be liable to deformation for flexibility. On the other hand, it brings difficulties to align the plug contact with the receptacle contacts thereby effecting reliablity of electrical connections therebetween. If one or more of the receptacle beams are out of position, it is very easy for the corresponding plug blades to fail to mate properly.

Hence, a low profile electrical connector with high density and excellent contact stability is highly desired.

BRIEF SUMMARY OF THE INVENTION

Accordingly, it is an object of the present invention to provide a high density connector with positive mechanical positioning of contacts beams to help to ensure correct mating with a complementary plug.

In order to achieve the above-mentioned object, a high density, high speed, electrical connector comprises an insulative housing and an array of conductive contacts partially positioned in the housing. The housing has a base wall and side wall together definging a receiving space. The top edge of the side wall has a thickness larger than other portion of the side wall so that the pivot point is shifted when the connectors mate at an angle to thereby protect the contacts. Each contact has a body portion, a pair of cantilevered beams extending from the body portion, and a flatform formed at a bottom of the body portion. A stabilizer is assembled in the receiving space of the housing. The stabilizer provides a general flat planar surface on a top and defines a number of cavities opened to the surface. The cantilevered beams extend through the cavities of the stabilizer and exposed partially outside the surface thereof.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
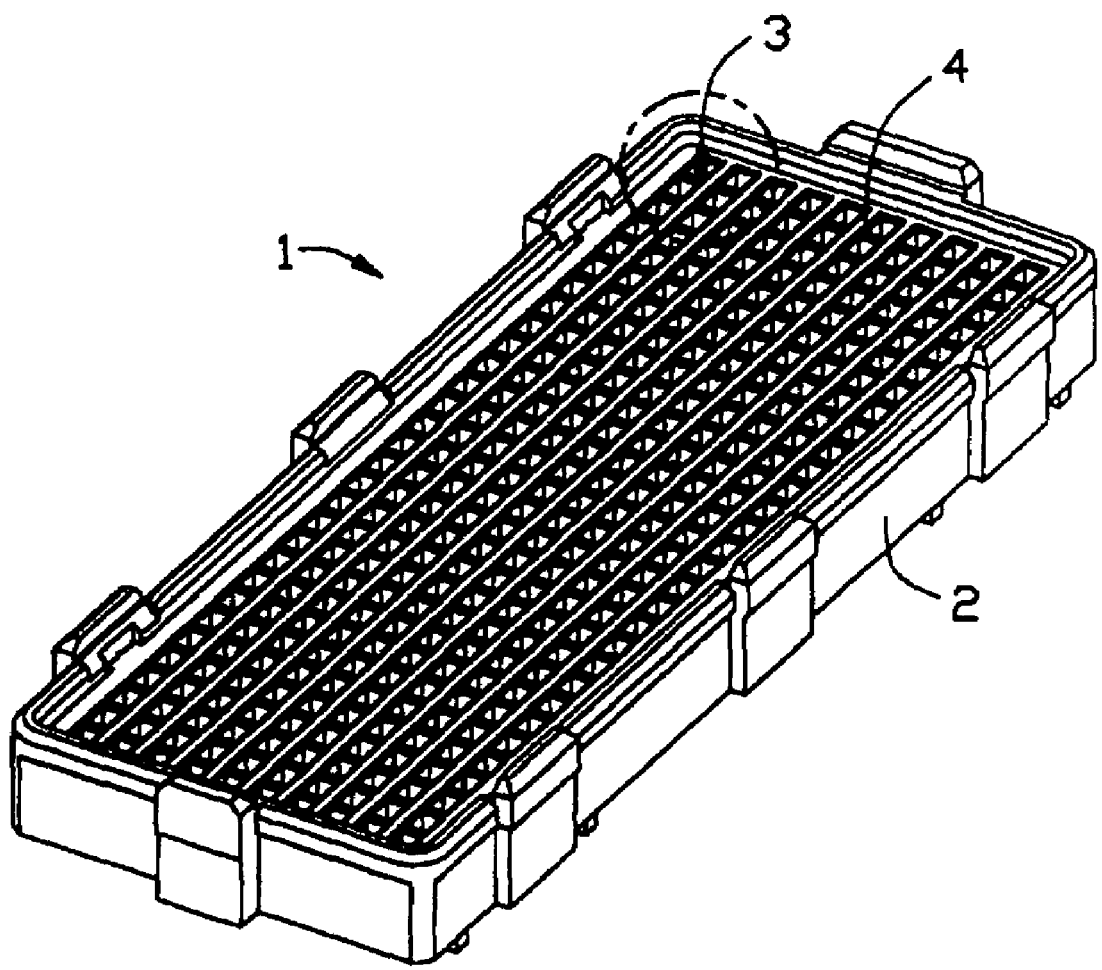
FIG. 1 is a perspective view of a receptacle connector in accordance with the present invention.

Reference will now be made to the drawing figures to describe the present invention in detail.

With reference to FIG. 1, an electrical connector assembly 100 in accordance with the present invention, which is adapted for interconnecting two circuit boards (not shown), comprises a receptacle 1 mounting on a first circuit board and a plug 9 mounting on a second board and mating with the receptacle 1.

Figure 2:
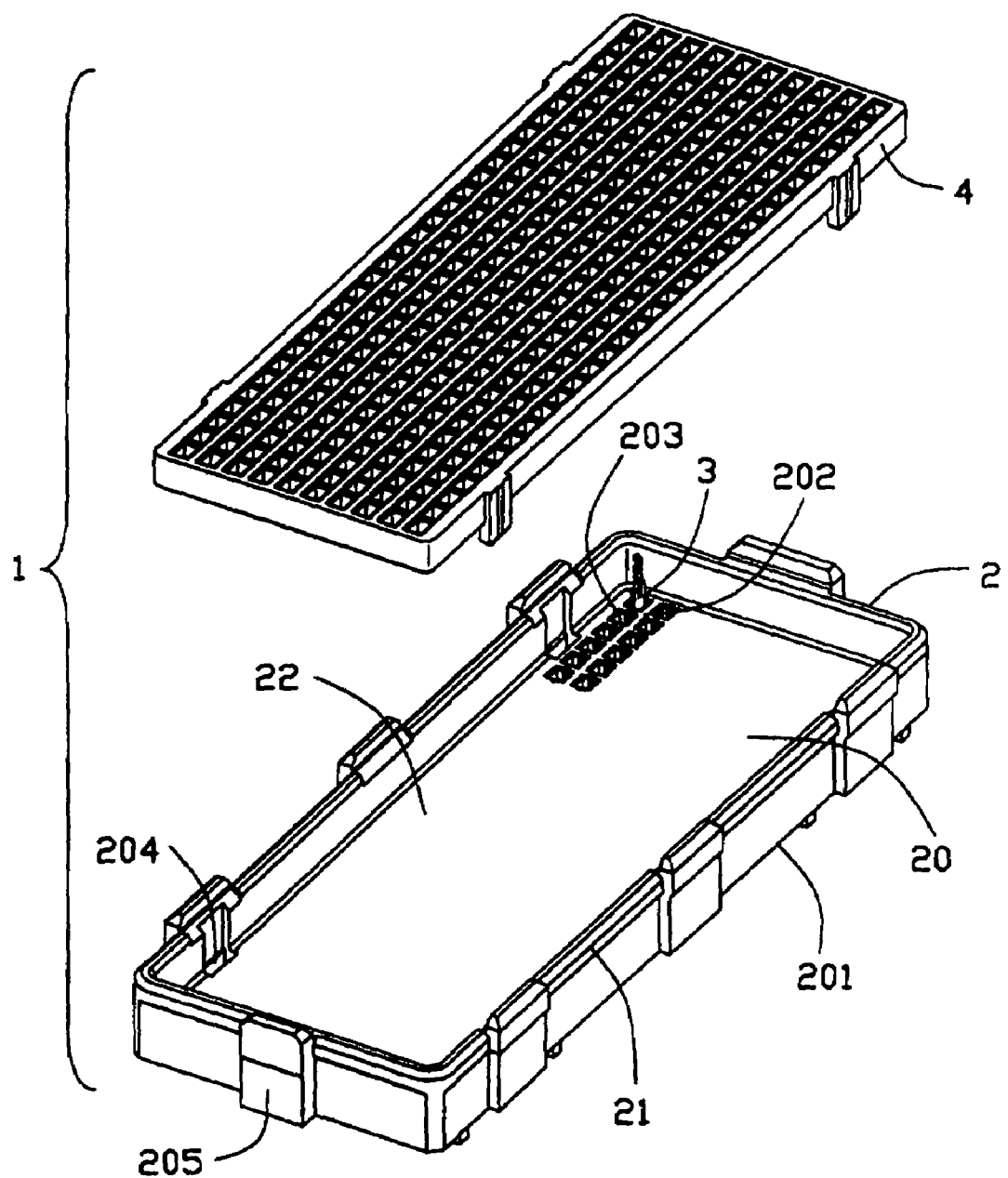
FIG. 2 a perspective view of the receptacle with a stabilizer being detached therefrom.
Figure 3:
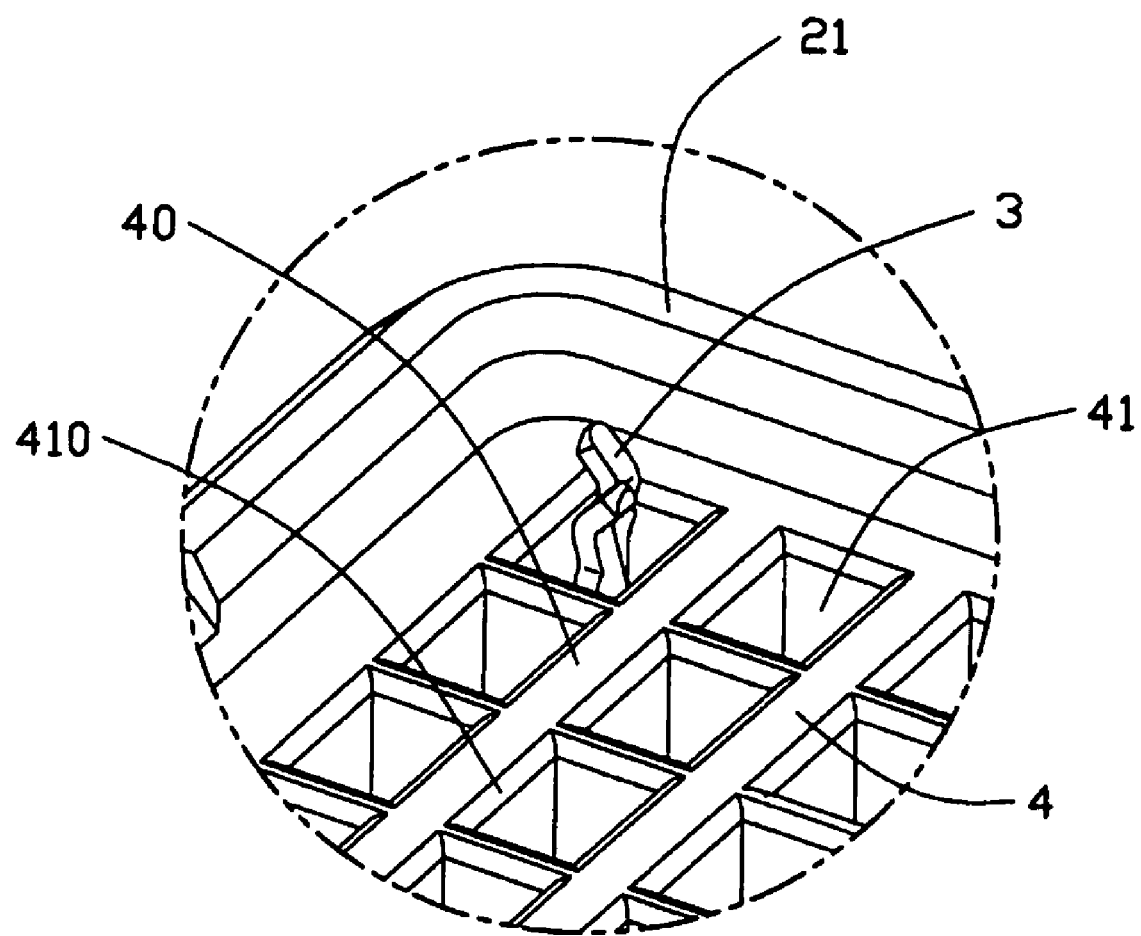
FIG. 3 is a partial enlarged view of the receptacle with only one examplary contact in shown.

As seen in FIGS. 2–3, the receptacle 1 is provided with a dielectric housing 2, a plurality of conductive contacts 3 received in the housing 2, and a stabilizer 4 detachably assembled onto the housing 2. The dielectric housing 2 has a base 20, described throughout as a plate, side walls 21 extending upwardly from periphery edges of the base plate 20, and a receiving cavity 22 defined therebetween which provides space for receiving the stablizer 4.

The base plate 20 has a lower mounting face 201 confronting to the printed circuit board, a parallel, upper receiving face 202, opposite to the mounting face 201 and confronting to the stablizer 4, and a plurality of apertures 203 extending through the base plate 20 from the mounting face 201 to the receiving face 202. The apertures 203 are arranged in multiple rows and columns for receiving corresponding conductive contacts 3. Only a few of apertures 203 and one conductive receptacle contact 3 are shown for simplicity.

Figure 4:
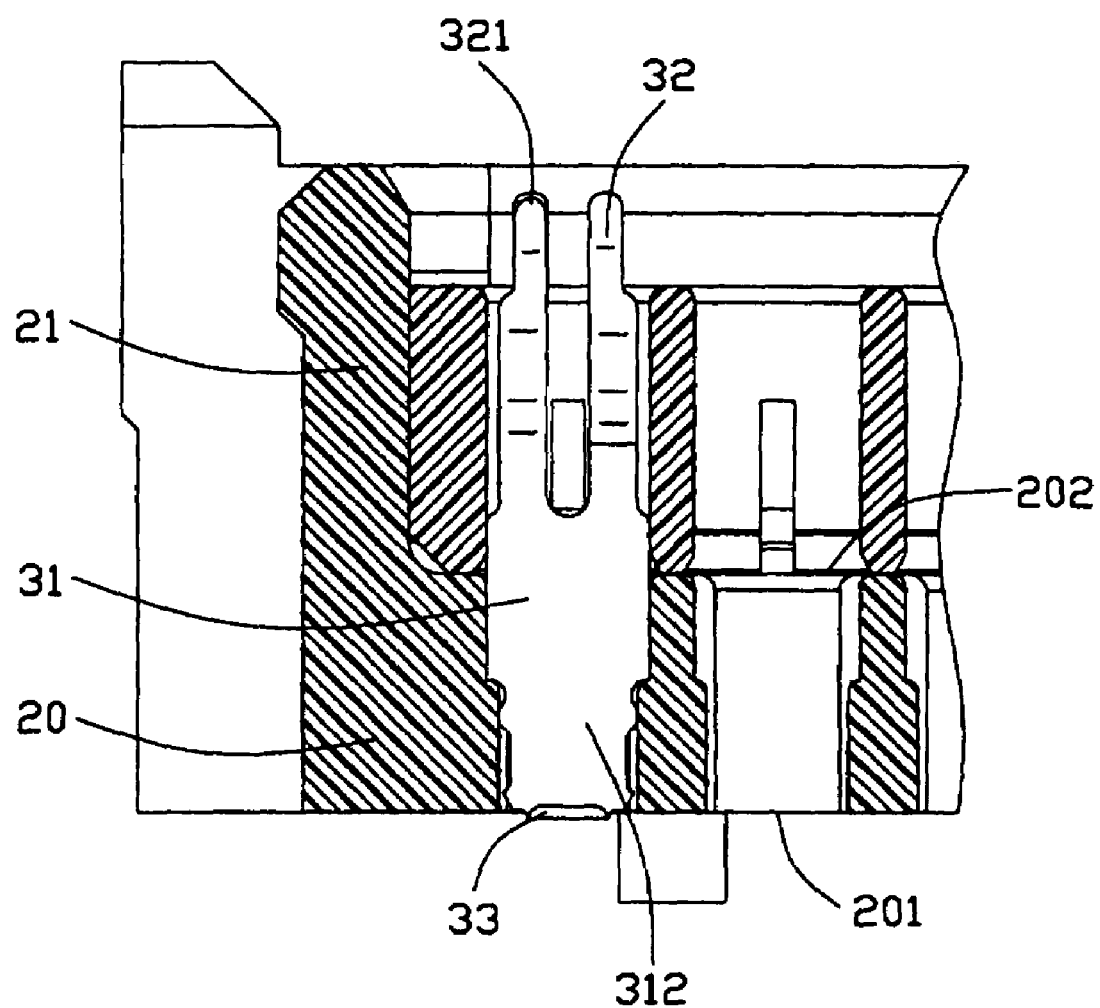
FIG. 4 is a partial enlarged cross-section view showing the contact extending within a housing and the stabilizer.
Figure 5:
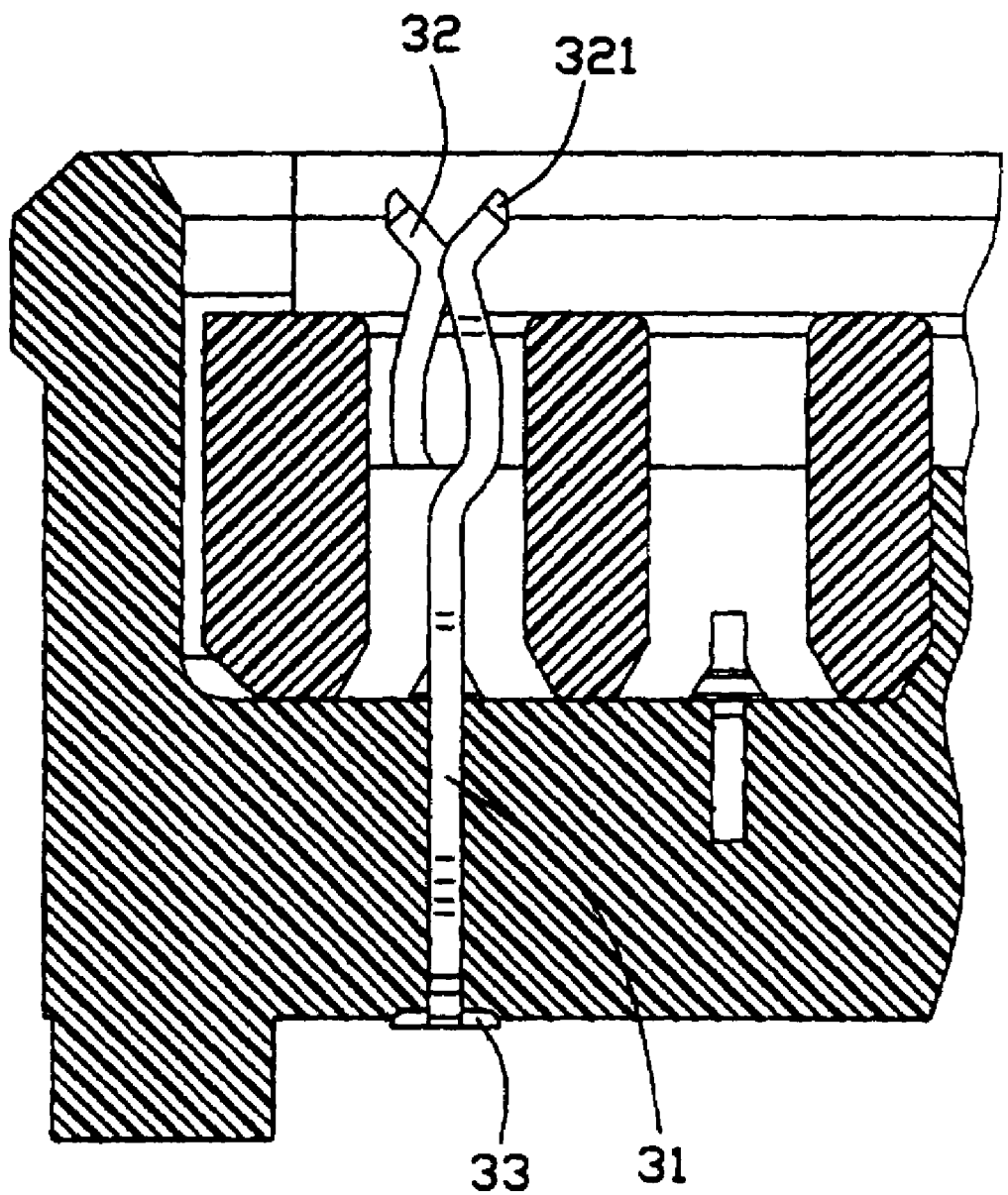
FIG. 5 is another partial enlarged cross-section view showing the contact exending within the housing and the stabilizer.
Figure 6:
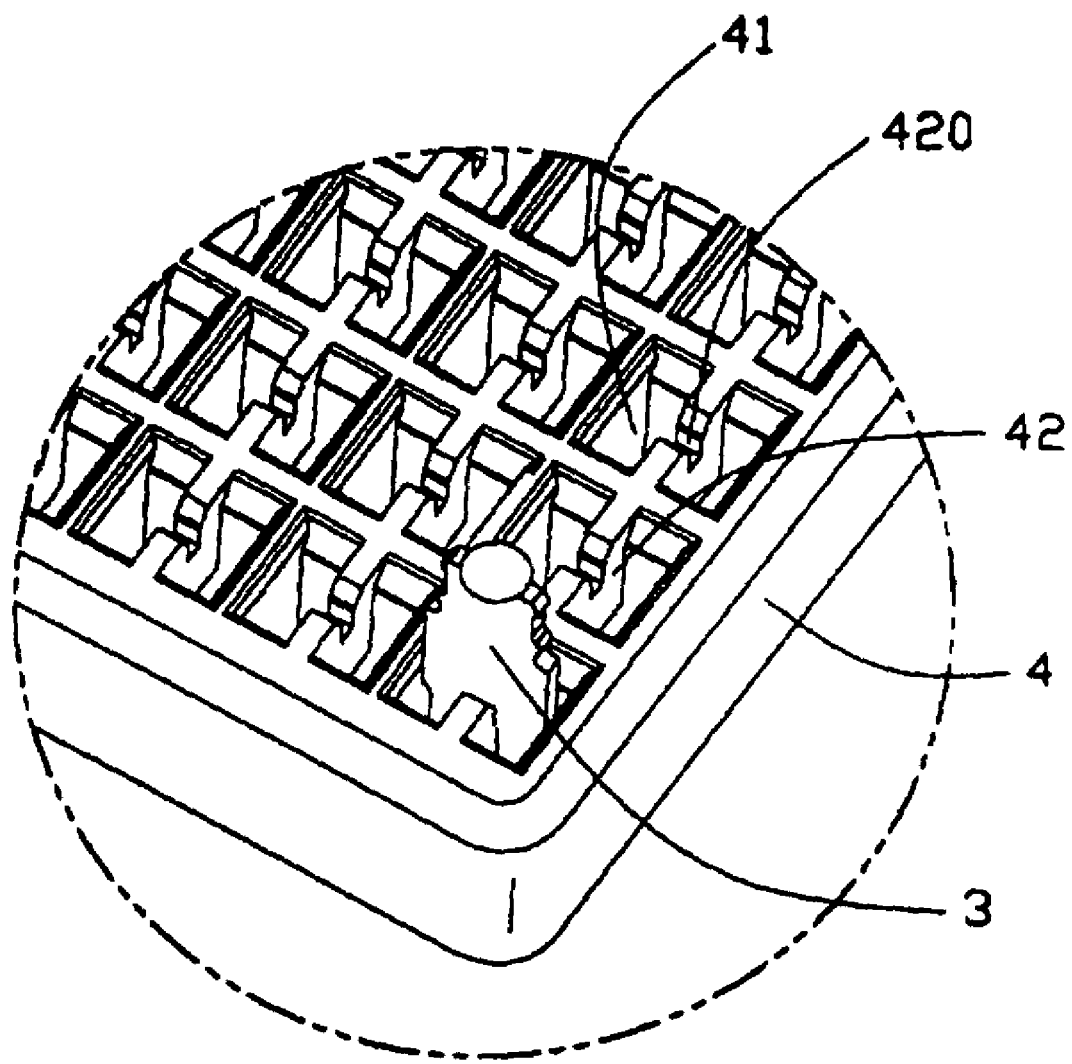
FIG. 6 is a partial enlarged, perspective bottom view showing the contact received in the stabilizer.

FIGS. 4–6 respectively illustrate one example receptacle contact 3 is received in a corresponding aperture 203 of the dielectric housing 2. The contact 3 has a rectangular body portion 31, a pair of cantilevered beams 32 extending upwardly from a top edge of the body portion 31, and a platform 33 formed in a bottom edge of the body portion 31. The platform 33 is configured for being attached thereon a solder ball (not shown) so that soldering the contact 3 to a conductive pad of the first printed circuit board. The body portion 31 includes an intermediate portion 311 connecting with the pair of cantilevered beams 32 and a retaining portion 312 with barbs or ribs (not labeled) formed thereon along two opposite lateral edges thereof. Each cantilevered beam 32 is provided with a contact end 321. It can be seen that, in the perfered embodiment, the body portion 31 is partially received in the aperture 203 with a top section thereof extending upwardly beyond the receiving face 202.

Figure 7:
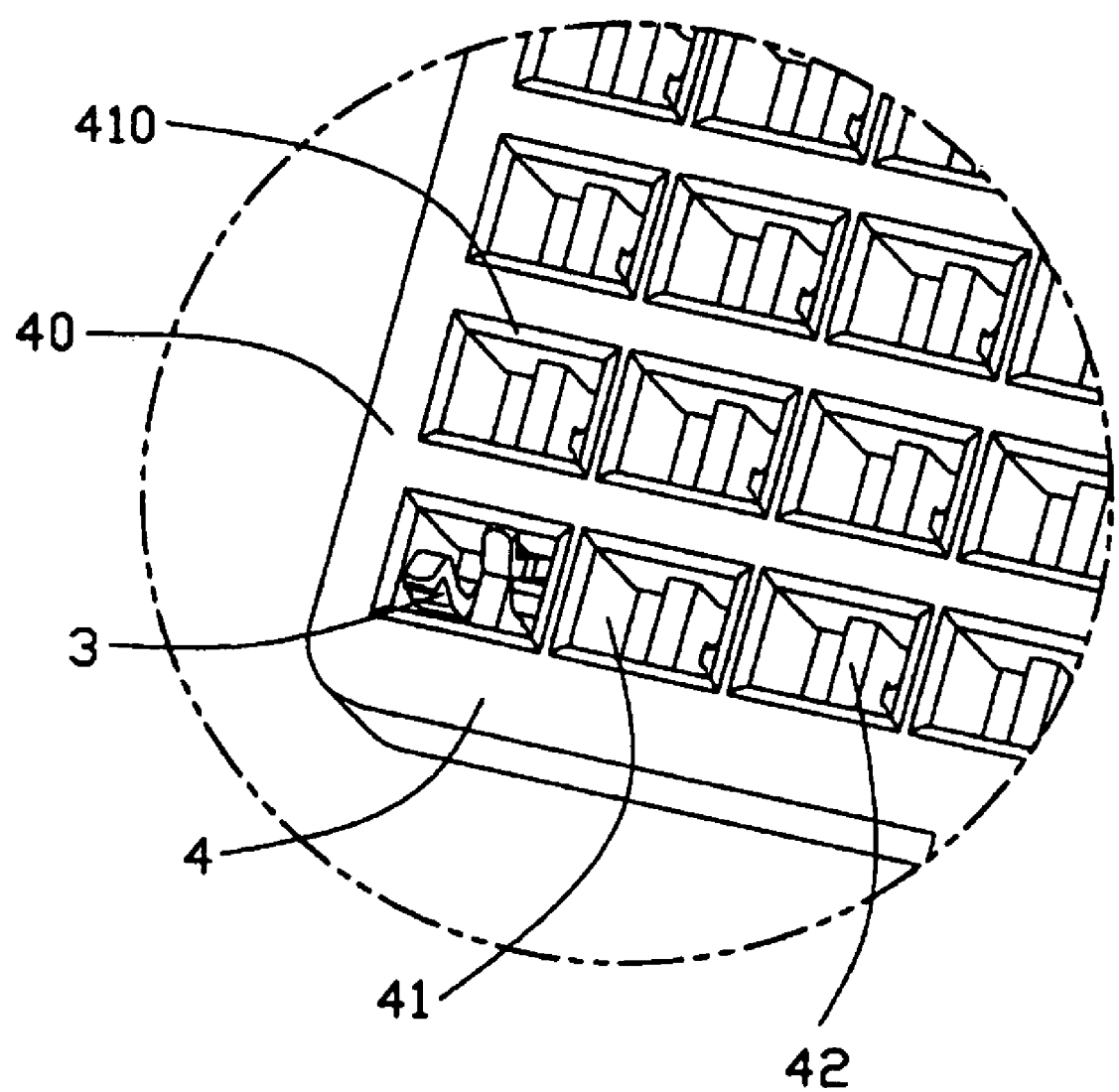
FIG. 7 is a view similar to FIG. 6 while taken from a top side.

Turning to FIG. 7 in conjunction with FIGS. 2–3, the stabilizer 4 is configured as a substantially planar plate with a flat planar mating surface 40 on a top. The stabilizer 4 has a plurality of cavities 41 defined therethrough with a recetangular opening 410 opened to the flat planar mating surface 40. Each cavity 41 is provided with a partition wall 42 extending thereacross along a direction perpendicular to insertion of the contacts 3. The partition wall 42 defines a vertical slot 420. The contacts 3 straddle on the partition walls 42, respectively. Specifically, a part of the body portion 31 extendes into a cavity with the pair of cantilevered beams 32 standing on oppsite sides of the partition wall 42. The contact ends 321 are exposed to the outside above the flat planar mating surface 40. There are ribs 43 formed at a periphery thereof for engaging with recesses 204 defined in the housing 2 to thereby secure the stabilizer 4 onto the housing 2.

Figure 8:
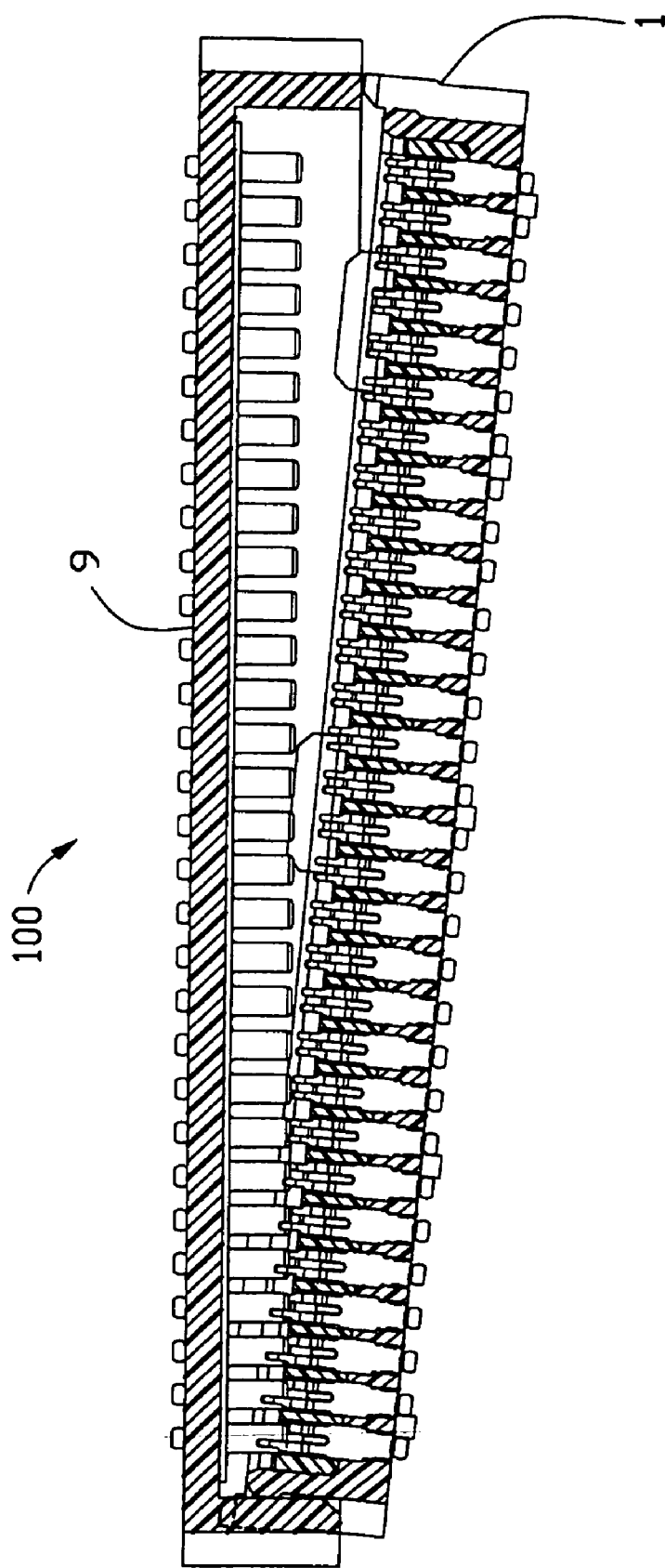
FIG. 8 is a diagrammatic view showing a plug initially mating the receptacle at an angle.
Figure 9:
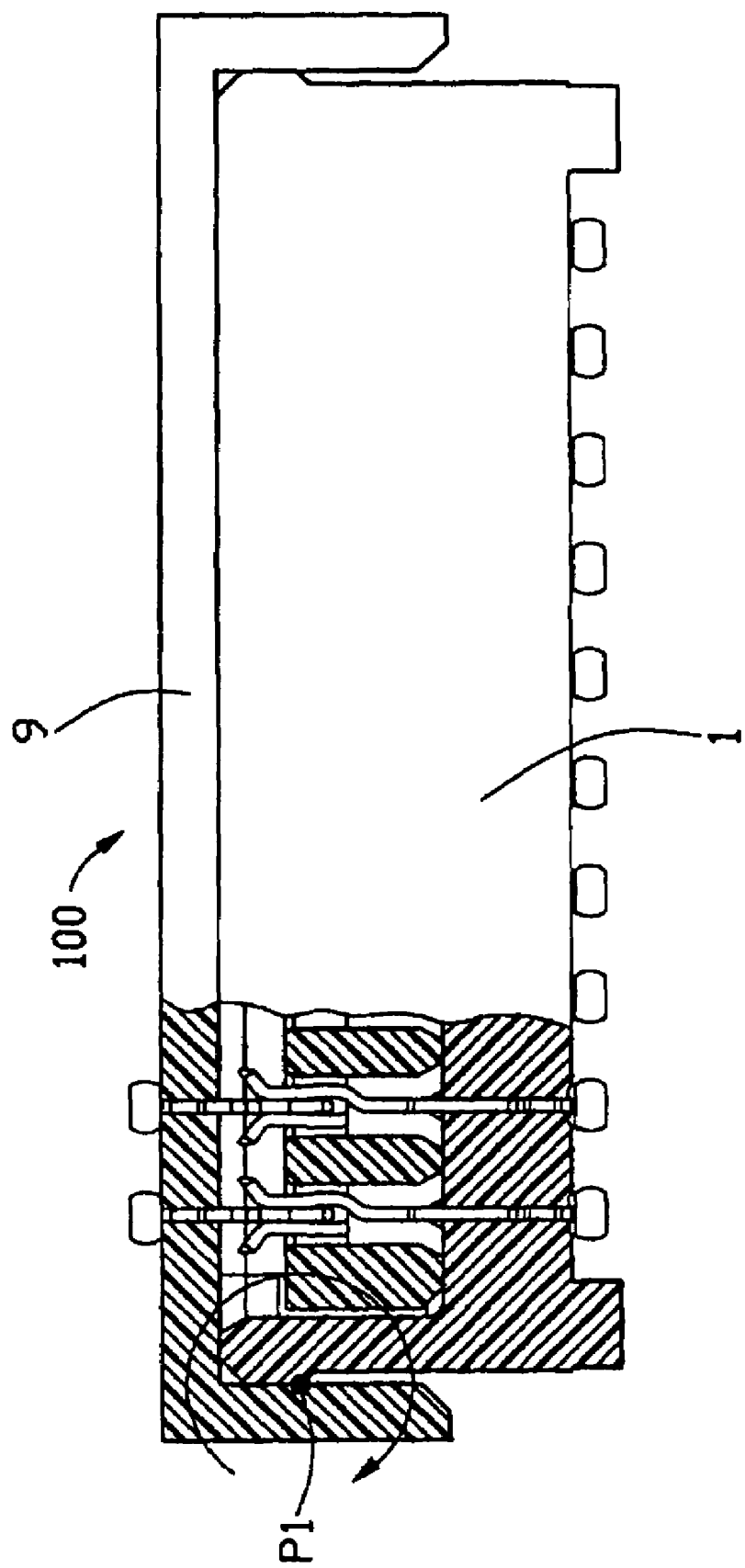
FIG. 9 is a view showing the plug engaging the receptacle completely.
Figure 10:
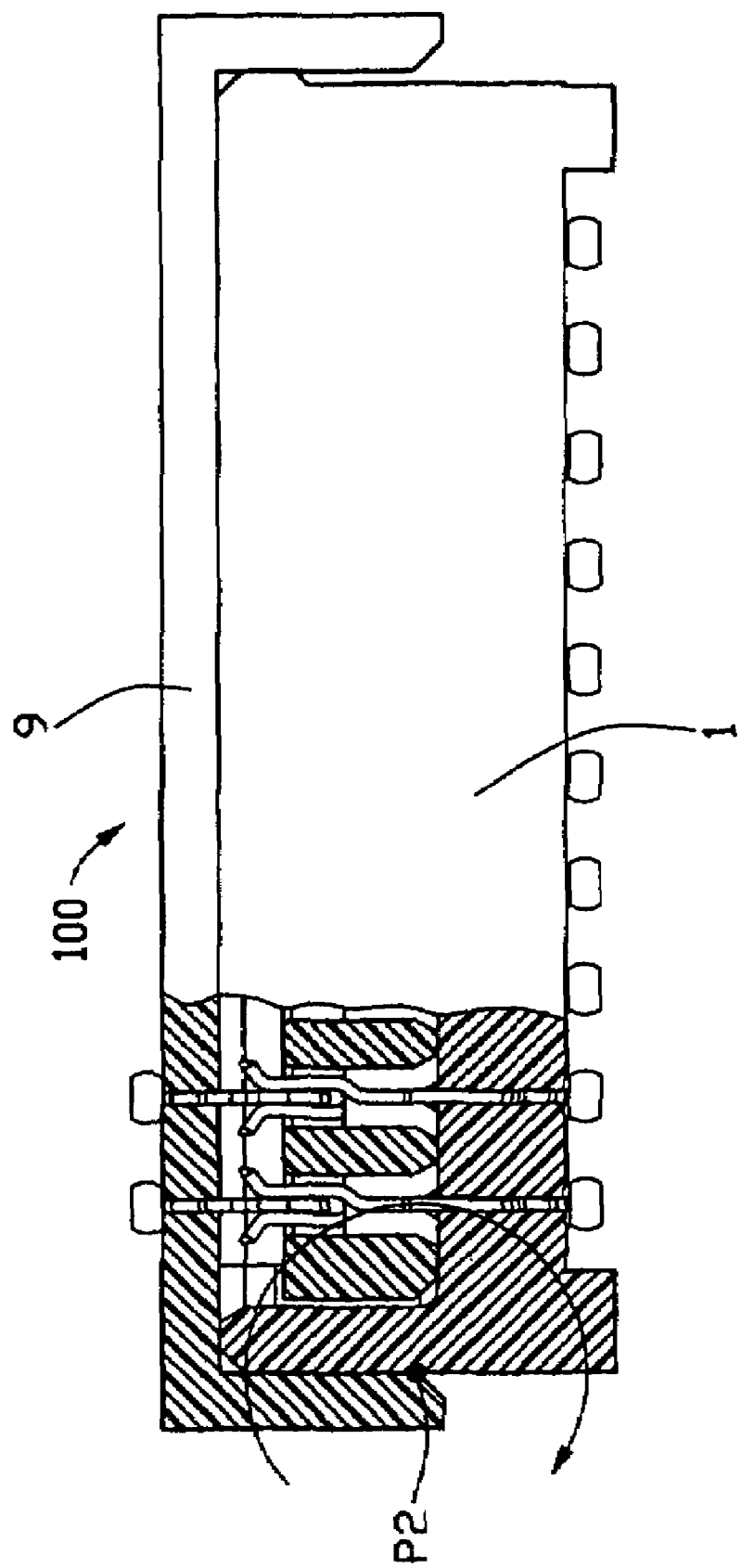
FIG. 10 is a view similar to FIG. 9 while the receptacle having a side wall with even thickness.

Referring to FIGS. 8–10 in conjunction with FIGS. 1–2, the side wall 21 of the housing 2 has a differ thickness from top to bottom. In the preferred embodiment, the top of the side wall 21 has a selected thickness larger than that of the bottom. In such a structure, the contacts 3 experience minimal horizontal motion during mating with the plug 9. In other words, when the two connectors engage, the shifted pivot point P1 (compared with pivot point P2 of the receptacle housing having a side wall with even thickness, shown in FIG. 10) will prevent contact damage. Additionally, center key 205 of the housing 2 is also tightly toleranced. Hence, the present invention provides the contact protection when the two complementary connectors engage with or disengage from each other at an angle (that is, one side is fully seated, while the other side is not seated).

It should be noted here that, the plug 9 has a conventional structure, which includes a substantial rectangular housing and plug contacts (not labeled) received in the housing. The contacts are configured in a blade shape.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:
1. An electrical connector, comprising:
   an insulative housing defining a plurality of passages extending from a mating face to a mounting face thereof;
   conductive contacts arranged in rows and columns, each comprising a body portion partially inserted in said passage and a pair of cantilevered beams extending from said body portion above said mating face; and
   a stabilizer attached on said mating face of said housing and providing a general flat planar surface opposite to said mating face, said stabilizer defining a plurality of cavities in correspondence with said passages and forming a partition wall extending across each cavity, wherein said cantilevered beams of said contact straddle on said partition wall with free tips thereof exposed beyond said flat planar surface of said stabilizer.
2. An electrical connector as described in claim 1, wherein said stabilizer has a plurality of ribs formed at a periphery thereof, and wherein said housing defines recesses to receive said ribs to thereby secure said stabilizer on said housing.
3. An electrical connector as described in claim 1, wherein each cavity of said satabilizer comprises a rectangular opening opened to said flat planar surface.
4. An electrical connector as described in claim 3, wherein each partition wall in said cavity defines a slot for seating said contact.
5. An electrical connector as described in claim 1, wherein said partition wall extends perpendicular to the insertion direction of said contact.
6. An electrical connector as described in claim 1, wherein said body portion of each contact has a retaining portion with barbs for interference fitting said contact in said passage of said housing.
7. An electrical connector as described in claim 1, wherein each contact also has a tail portion adjacent the mounting face of said housing adapted to receive a fusible element.
8. An electrical connector assembly comprising:
   a first and a second boards exending parallel to each other with conductive pads formed thereon;
   a receptacle mounted on said first board, said receptacle comprising:
      a receptacle housing including a general flat base, a side wall extending perpendicular to said base, and a plurality of passages extending through said base, said side wall having a different thickness along its height;
      a plurality of receptacle contacts connected to said receptacle housing and partially received in corresponding passages; and
      a stabilizer assembled to said receptacle housing and defining a substantial planar face and a pluraltiy of rectangular cavities, said receptacle contacts projecting through said rectangular cavities and extending beyond said planar face of said stabilizer; and a plug mounted on a second board, said plug comprising a plug housing and a plurality of plug contacts received in said plug housing, which are configured in a blade shape adapted to engage with said receptacle contacts of said receptacle to thereby establishing an electrial connection between said first and second boards.

9. An electrical connector assembly as described in claim 8, wherein top of said side wall of said receptacle housing has a selected thickness larger than the thickness of other part engaged within said plug housing.

10. An electrical connector assembly as described in claim 8, wherein said stabilizer comprises a partition wall extending in each rectangular cavity, and wherein each contact straddles on said partition wall.

11. An electrical connector as assembly described in claim 10, wherein each partition wall defines a slot for seating said contact.

12. An electrical connector assembly as described in claim 11, wherein said partition wall extends perpendicular to the insertion direction of said contact.

13. An electrical connector assembly as described in claim 8, wherein each contact comprises a body portion, a pair of cantilevered beams projecting from a top of said body portion, and a tail portion adjacent a bottom of said body portion adapted for receiving a fusible element thereon.

* * * * *